(12) United States Patent
Park et al.

(10) Patent No.: US 9,520,852 B2
(45) Date of Patent: Dec. 13, 2016

(54) MULTILAYER CHIP ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Min Cheol Park, Suwon-Si (KR); Sang Soo Park, Suwson-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 233 days.

(21) Appl. No.: 14/456,857

(22) Filed: Aug. 11, 2014

(65) Prior Publication Data

US 2015/0325378 A1 Nov. 12, 2015

(30) Foreign Application Priority Data

May 8, 2014 (KR) .................. 10-2014-0054599

(51) Int. Cl.
*H03H 7/01* (2006.01)
*H01G 2/06* (2006.01)
(Continued)

(52) U.S. Cl.
CPC ............ *H03H 7/0115* (2013.01); *H01F 37/00* (2013.01); *H01F 37/005* (2013.01); *H01G 2/065* (2013.01); *H01G 4/008* (2013.01); *H01G 4/018* (2013.01); *H01G 4/12* (2013.01); *H01G 4/1227* (2013.01); *H01G 4/30* (2013.01); *H01G 4/40* (2013.01); *H03H 7/01* (2013.01); *H01G 2/06* (2013.01); *H01G 4/0085* (2013.01); *H01G 4/012* (2013.01); *H03H 2001/0085* (2013.01)

(58) Field of Classification Search
CPC .................... H03H 2001/0085; H03H 7/0115; H01G 4/40; H01G 4/12
USPC .......................................... 333/185; 361/320
See application file for complete search history.

(56) References Cited

U.S. PATENT DOCUMENTS

2007/0002513 A1* 1/2007 Matsuoka ................ H03H 7/38
                                                                            361/118
2012/0162853 A1    6/2012 Togashi

FOREIGN PATENT DOCUMENTS

EP          2048777 A1     4/2009
JP      2006-295111 A    10/2006
(Continued)

*Primary Examiner* — Robert Pascal
*Assistant Examiner* — Rakesh Patel
(74) *Attorney, Agent, or Firm* — McDermott Will & Emery LLP (57) ABSTRACT

A multilayer chip electronic component may include: a ceramic body including a plurality of dielectric layers; an inductor part disposed within the ceramic body; a capacitor part disposed within the ceramic body; a first dummy electrode disposed within the ceramic body and a second dummy electrode disposed within the ceramic body; and first to sixth external electrodes disposed on first and second main surfaces of the ceramic body, a first connection terminal disposed on the second main surface and first end surface of the ceramic body, and a second connection terminal disposed on the second main surface and second end surface of the ceramic body. The inductor part may include first and second inductor parts, and the inductor part and the capacitor part are connected to each other.

14 Claims, 9 Drawing Sheets

(51) Int. Cl.
*H01G 4/008* (2006.01)
*H01G 4/018* (2006.01)
*H01F 37/00* (2006.01)
*H01G 4/12* (2006.01)
*H01G 4/30* (2006.01)
*H01G 4/40* (2006.01)
H03H 1/00 (2006.01)
H01G 4/012 (2006.01)

(56) References Cited

FOREIGN PATENT DOCUMENTS

JP    2008-35122 A    2/2008
JP    2012-138415 A    7/2012

* cited by examiner

MULTILAYER CHIP ELECTRONIC COMPONENT AND BOARD HAVING THE SAME

CROSS-REFERENCE TO RELATED APPLICATION

This application claims the benefit of Korean Patent Application No. 10-2014-0054599 filed on May 8, 2014, with the Korean Intellectual Property Office, the disclosure of which is incorporated herein by reference.

BACKGROUND

The present disclosure relates to a multilayer chip electronic component and a board having the same.

In accordance with rapid growth of the market for small portable terminals due to the emergence of smart phones or tablet personal computers (PCs), multifunctionalization, miniaturization, and thinning of portable terminals have been further intensified.

Among these, since wireless communications circuits have been modularized, they require decreases in volumes thereof, in addition to multiband correspondence.

Meanwhile, as processing performance of a central processing unit (CPU) of a base band part is improved, wireless modules or radio frequency (RF) analog circuits are driven at high frequency to be subjected to electromagnetic wave interference from peripheral circuits, such that communications disruption may easily occur.

Meanwhile, an LC filter, a multilayer chip electronic component, is mounted on printed circuit boards of various electronic products including display devices such as liquid crystal displays (LCDs), plasma display panels (PDPs) and the like, computers, smartphones, mobile phones, and the like, to serve as an electronic component for suppressing noise.

In accordance with the miniaturization of portable terminals, demand for such LC filters to be reduced in size while having high efficiency have also been required.

In addition, along with the rapid development of mobile terminals such as tablet personal computers (PCs), ultra books, and the like, the miniaturization and high integration of microprocessors have been conducted.

Therefore, an area of a printed circuit board is decreased and correspondingly, a space for mounting the LC filter is limited, such that multilayer chip electronic components satisfying the limited mounting space have been continuously requested.

Further, since portable terminals are being used within higher frequency ranges than ever, LC filters having excellent efficiency in such high frequency regions are required.

RELATED ART DOCUMENT (Patent Document 1) Japanese Patent Laid-Open Publication No. 2012-138415

SUMMARY

An exemplary embodiment in the present disclosure may provide a multilayer chip electronic component and a board having the same.

According to an exemplary embodiment in the present disclosure, a multilayer chip electronic component may include: a ceramic body including a plurality of dielectric layers and having first and second main surfaces opposing each other, first and second side surfaces opposing each other, and first and second end surfaces opposing each other; an inductor part formed within the ceramic body and including first and fourth internal electrodes exposed to the first and second main surfaces and second and third internal electrodes exposed to the first main surface; a capacitor part formed within the ceramic body and including a fifth internal electrode exposed to the first main surface and a sixth internal electrode exposed to the second main surface; a first connecting electrode formed within the ceramic body and exposed to the second main surface and the first end surface of the ceramic body and a second connecting electrode formed within the ceramic body and exposed to the second main surface and the second end surface of the ceramic body; and first to sixth external electrodes formed on the first and second main surfaces of the ceramic body and electrically connected to the first to sixth internal electrodes, a first connection terminal formed on the second main surface and the first end surface of the ceramic body and connected to the first connecting electrode, and a second connection terminal formed on the second main surface and the second end surface of the ceramic body and connected to the second connecting electrode, wherein the inductor part is composed of first and second inductor parts, and the inductor part and the capacitor part are connected to each other.

The first internal electrode may be connected to the second and fifth external electrodes, the second internal electrode may be connected to the fifth and sixth external electrodes, the third internal electrode may be connected to the fourth and sixth external electrodes, and the fourth internal electrode may be connected to the first and fourth external electrodes.

The fifth internal electrode may be connected to the sixth external electrode, and the sixth internal electrode may be connected to the third external electrode.

The second and third internal electrodes and the fifth internal electrode may be connected to each other through the sixth external electrode, such that the inductor part and the capacitor part may be connected to each other.

The first and second connection terminals may be formed of a plating layer.

According to an exemplary embodiment in the present disclosure, a multilayer chip electronic component may include: a ceramic body including a plurality of dielectric layers and having first and second main surfaces opposing each other, first and second side surfaces opposing each other, and first and second end surfaces opposing each other; an inductor part formed within the ceramic body and including first and fourth internal electrodes exposed to the first and second main surfaces and second and third internal electrodes exposed to the first main surface; a capacitor part formed within the ceramic body and including two fifth internal electrodes exposed to the second main surface and a sixth internal electrode exposed to the second main surface; a first connecting electrode formed within the ceramic body and exposed to the second main surface and the first end surface of the ceramic body and a second connecting electrode formed within the ceramic body and exposed to the second main surface and the second end surface of the ceramic body; and first to sixth external electrodes formed on the first and second main surfaces of the ceramic body and electrically connected to the first to sixth internal electrodes, a first connection terminal formed on the second main surface and the first end surface of the ceramic body and connected to the first connecting electrode, and a second connection terminal formed on the second main surface and to the second connecting electrode, wherein the capacitor part is composed of first and second capacitor parts, and the inductor part and the capacitor part are connected to each other.

The two fifth internal electrodes may be formed on a single dielectric layer to be insulated from each other.

The two fifth internal electrodes may be separately formed on individual dielectric layers.

The first internal electrode may be connected to the second and fifth external electrodes, the second internal electrode may be connected to the fifth and sixth external electrodes, the third internal electrode may be connected to the fourth and sixth external electrodes, and the fourth internal electrode may be connected to the first and fourth external electrodes.

The two fifth internal electrodes may be connected to the first and second external electrodes, respectively, and the sixth internal electrode may be connected to the third external electrode.

The first and fourth internal electrodes and the two fifth internal electrodes may be connected to each other through the first and second external electrodes, such that the inductor part and the capacitor part may be connected to each other.

The first and second connection terminals may be formed of a plating layer.

According to an exemplary embodiment in the present disclosure, a board having a multilayer chip electronic component may include: a printed circuit board having first to third electrode pads disposed thereon; and the multilayer chip electronic component as described above mounted on the printed circuit board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

The disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively. Here, the width direction may be used to have the same concept as a stacking direction in which dielectric layers are stacked.

Multilayer Chip Electronic Component

Hereinafter, exemplary embodiments of the present disclosure will be described in detail with reference to the accompanying drawings.

Figure 1:
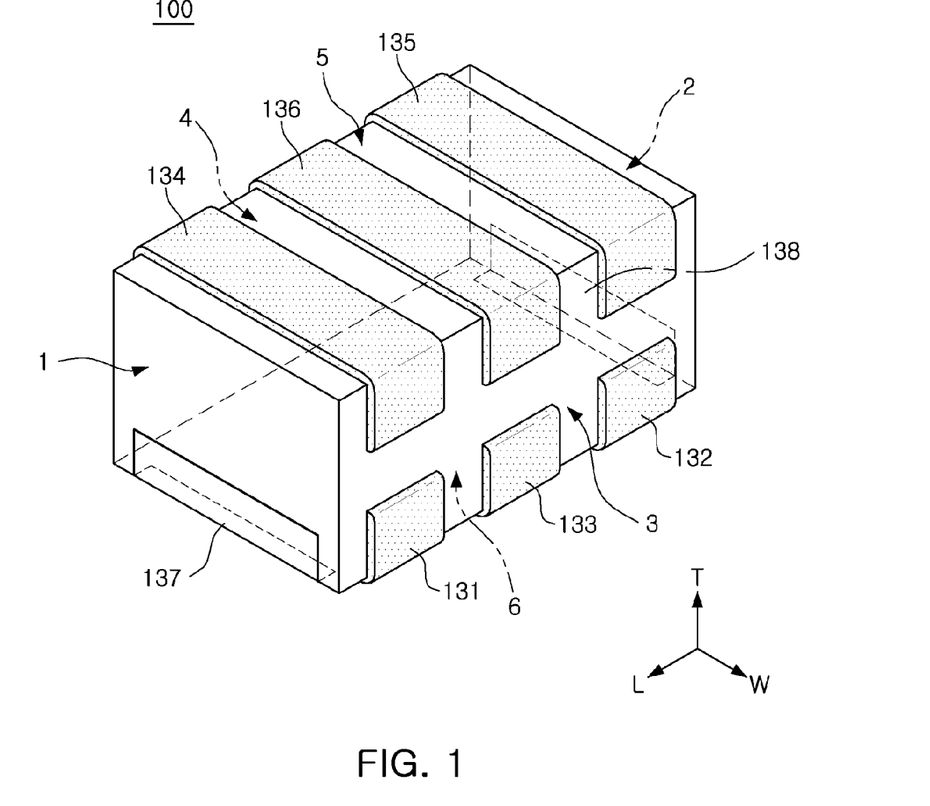
FIG. 1 is a perspective view of a multilayer chip electronic component according to an exemplary embodiment of the present disclosure.

FIG. 1 is a perspective view of a multilayer chip electronic component according to an exemplary embodiment of the present disclosure.

Figure 2:
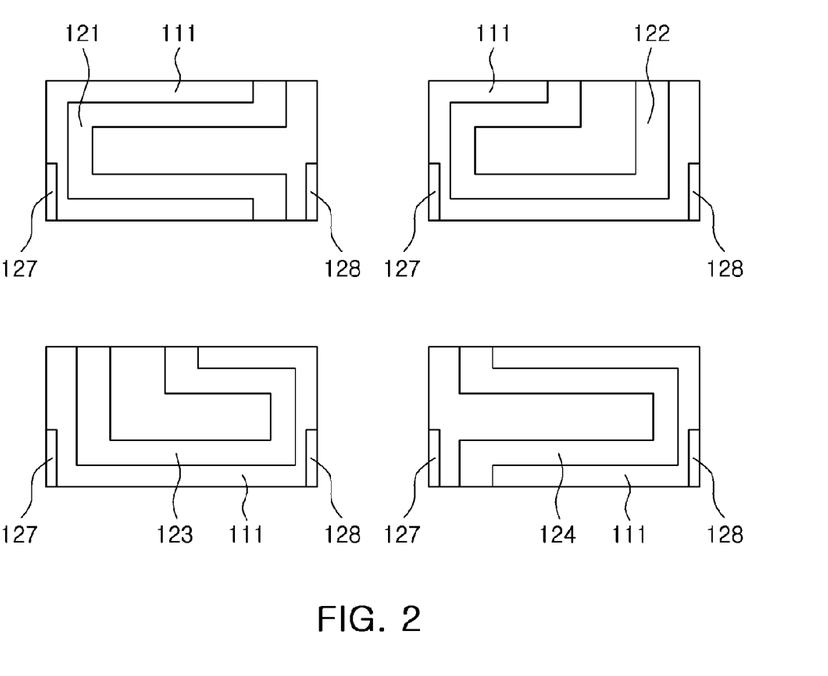
FIG. 2 is a plan view illustrating first to fourth internal electrodes usable in the multilayer chip electronic component shown in FIG. 1.

FIG. 2 is a plan view illustrating first to fourth internal electrodes usable in the multilayer chip electronic component shown in FIG. 1.

Figure 3:
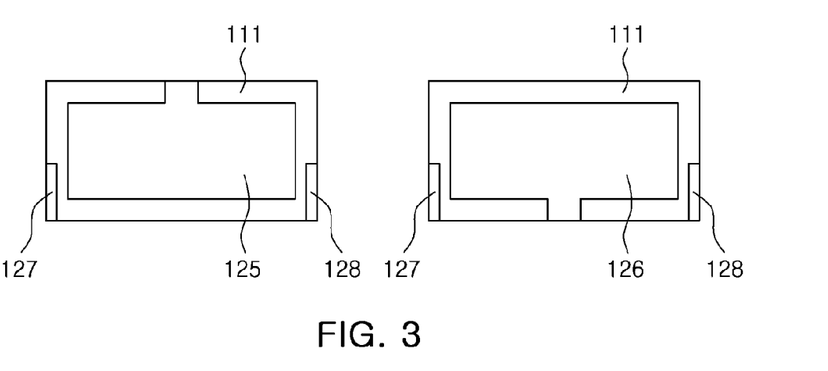
FIG. 3 is a plan view illustrating fifth and sixth internal electrodes usable together with the first to fourth internal electrodes shown in FIG. 2.

FIG. 3 is a plan view illustrating fifth and sixth internal electrodes usable together with the first to fourth internal electrodes shown in FIG. 2.

Figure 4:
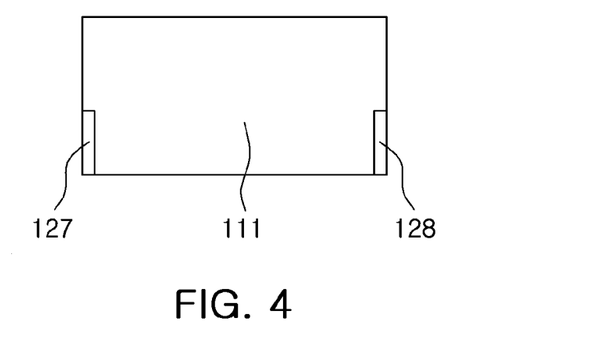
FIG. 4 is a plan view illustrating first and second connecting electrodes usable in the multilayer chip electronic component shown in FIG. 1.

FIG. 4 is a plan view illustrating first and second connecting electrodes usable in the multilayer chip electronic component shown in FIG. 1.

Referring to FIGS. 1 through 4, a multilayer chip electronic component 100 according to an exemplary embodiment of the present disclosure may include a ceramic body 110 including a plurality of dielectric layers 111 and having first and second main surfaces opposing each other, first and second side surfaces opposing each other, and first and second end surfaces opposing each other.

In the exemplary embodiment, the ceramic body 110 may have first and second main surfaces 5 and 6 opposing each other, and first and second side surfaces 3 and 4 and first and second end surfaces 1 and 2 that connect the first and second main surfaces 5 and 6 to each other.

A shape of the ceramic body 110 is not particularly limited, but may be a hexahedral shape as shown in the exemplary embodiment.

The ceramic body 110 may be formed by stacking the plurality of dielectric layers, and a plurality of internal electrodes 121 to 126 (sequentially representing first to sixth internal electrodes) may be disposed in the ceramic body 110 to be separated from one another with each of dielectric layers interposed therebetween.

The plurality of dielectric layers 111 configuring the ceramic body 110 may be in a sintered state and be integrated with each other so that boundaries between adjacent dielectric layers are not readily apparent.

The dielectric layers 111 may be formed by sintering ceramic green sheets containing a ceramic powder, an organic solvent, and an organic binder. The ceramic powder may have a high k-material and examples thereof may include a barium titanate ($BaTiO_3$) based material, a strontium titanate ($SrTiO_3$) based material, and the like. However, the ceramic powder is not limited thereto.

Meanwhile, as described below, dielectric layers forming a capacitor part may be formed using the ceramic powder, and dielectric layers forming an inductor part may be formed using a Ni—Cu—Zn based ferrite material, a Ni—Cu—Zn—Mg based ferrite material, or a Mn—Zn based ferrite material, but the present disclosure is not limited thereto.

The multilayer chip electronic component 100 may include the inductor part formed within the ceramic body 110 and including the first and fourth internal electrodes 121 and 124 exposed to the first and second main surfaces 5 and 6, and the second and third internal electrodes 122 and 123 exposed to the first main surface 5.

The inductor part may include a first inductor part L1 including the third and fourth internal electrodes 123 and 124 and a second inductor part L2 including the first and second internal electrodes 121 and 122.

According to an exemplary embodiment of the present disclosure, the first to fourth internal electrodes 121 to 124 may be formed of a conductive paste containing a conductive metal.

The conductive metal may be nickel (Ni), copper (Cu), palladium (Pd), or an alloy thereof, but is not limited thereto.

The internal electrodes may be printed on ceramic green sheets forming the dielectric layers using the conductive paste by a printing method such as a screen printing method or a gravure printing method.

The ceramic green sheets on which the internal electrodes are printed may be alternately stacked and sintered, thereby forming the ceramic body.

In addition, the multilayer chip electronic component 100 may include a capacitor part C formed within the ceramic body 110 and including the fifth internal electrode 125 exposed to the first main surface 5 and the sixth internal electrode 126 exposed to the second main surface 6.

The fifth and sixth internal electrodes 125 and 126 may be formed of, for example, a conductive paste containing a conductive metal, similarly to the first to fourth internal electrodes 121 to 124, but are not particularly limited thereto.

The conductive metal may be nickel (Ni), copper (Cu), palladium (Pd), or an alloy thereof, but is not limited thereto.

In addition, the multilayer chip electronic component 100 may include a first connecting electrode 127 formed within the ceramic body 110 and exposed to the second main surface 6 and the first end surface 1 of the ceramic body 110 and a second connecting electrode 128 formed within the ceramic body 110 and exposed to the second main surface 6 and the second end surface 2 of the ceramic body 110.

The first and second connecting electrodes 127 and 128 may be formed of, for example, a conductive paste containing a conductive metal, similarly to the first to fourth internal electrodes 121 to 124, but are not particularly limited thereto.

The conductive metal may be nickel (Ni), copper (Cu), palladium (Pd), or an alloy thereof, but is not limited thereto.

In addition, the multilayer chip electronic component 100 may include first to sixth external electrodes 131 to 136 formed on the first and second main surfaces 5 and 6 of the ceramic body 110 and electrically connected to the first to sixth internal electrodes 121 to 126.

The first to third external electrodes 131 to 133 may be disposed on the second main surface 6 of the ceramic body to be spaced apart from each other, and the fourth to sixth external electrodes 134 to 136 may be disposed on the first main surface 5 of the ceramic body 110 be spaced apart from each other.

According to an exemplary embodiment of the present disclosure, a mounting surface of the multilayer chip electronic component 100 may be the main second surface 6 of the ceramic body 110.

As described above, since the multilayer chip electronic component according to an exemplary embodiment of the present disclosure is mounted on a board to be perpendicular thereto and the mounting surface thereof is the second main surface 6 of the ceramic body 110, although not shown, a marking part having a color different from that of other portions of the ceramic body 110 may be further formed on the outermost dielectric layer of one side of the ceramic body 110 in order to visually distinguish a mounting direction.

Therefore, external electrodes contacting first to third electrode pads on a board on which the multilayer chip electronic component is mounted, to be described below, may be the first to third external electrodes 131 to 133.

In this case, the first external electrode 131 may function as a signal input terminal, the second external electrode 132 may function as a signal output terminal, and the third external electrode 133 may function as a ground terminal or an earth terminal.

According to an exemplary embodiment of the present disclosure, it may be understood that three external electrodes 134 to 136 except for the first and second external electrodes 131 and 132 used as external terminals for connection with a power line and the third external electrode 133 used as the ground terminal may be used as connection terminals for forming the inductor part or terminals for connecting the inductor part and the capacitor part to each other.

Therefore, the fourth to sixth external electrodes 134 to 135 that may be used as the connection terminals for forming the inductor part or the terminals for connecting the inductor part and the capacitor part to each other may be non-contact terminals in a state of non-contact with the power line as described above, and may be positioned on an upper surface of the multilayer chip electronic component when the multilayer chip electronic component is mounted on a board.

That is, according to an exemplary embodiment of the present disclosure, since the fourth to sixth external electrodes 134 to 136, the non-contact terminals, may be formed on the upper surface of the multilayer chip electronic component rather than being formed on side surfaces of the multilayer chip electronic component, the implementation of downsizing may not be hindered by the non-contact terminals, which is advantageous in miniaturizing a product.

The first to sixth external electrodes 131 to 136 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the first to sixth external electrodes 131 to 136 is not particularly limited. That is, the first to sixth external electrodes 131 to 136 may be formed on the ceramic body by a printing method, a dipping method, or another method such as a plating method, or the like.

Subsequently, a plating layer may be further formed on the first to sixth external electrodes 131 to 136.

The multilayer chip electronic component 100 may be a 3-terminal LC filter having a total of six external electrodes and three contact terminals. However, the present disclosure is not limited thereto.

In addition, the multilayer chip electronic component 100 may include a first connection terminal 137 formed on the second main surface 6 and the first end surface 1 of the ceramic body 110 and connected to the first connecting electrode 127 and a second connection terminal 138 formed on the second main surface 6 and the second end surface 2 of the ceramic body 110 and connected to the second connecting electrode 128.

The first and second connection terminals 137 and 138 may be formed on the second main surface and both end surfaces of the ceramic body, respectively, whereby a direction of the multilayer chip electronic component may be determined at the time of mounting the multilayer chip electronic component on a board as described below.

The first and second connection terminals 137 and 138 may be formed of a conductive metal.

The conductive metal may be nickel (Ni), copper (Cu), tin (Sn), or an alloy thereof, but is not limited thereto.

That is, the first and second connection terminals 137 and 138 may be formed by a plating method, unlike the case of the first to sixth external electrodes 131 to 136. Therefore, the first and second connection terminals 137 and 138 may not contain glass, unlike the case of the first to sixth external electrodes 131 to 136.

Meanwhile, the first and second connection terminals 137 and 138, plating layers, may be connected to the first and second external electrodes 131 and 132, respectively, but is not limited thereto.

As described above, the first and second connection terminals 137 and 138 may be connected to the first and second external electrodes 131 and 132, respectively, such that solder may be formed on the first and second connection terminals 137 and 138 at the time of mounting the multilayer chip electronic component on a board, whereby adhesion properties of the multilayer chip electronic component may be improved.

Hereinafter, the first to sixth internal electrodes 121 to 126 and the first to sixth external electrodes 131 to 136 among components of the multilayer chip electronic component 100 according to an exemplary embodiment of the present disclosure will be described in detail with reference to FIGS. 2 through 4.

Referring to FIG. 2, the inductor part may be formed within the ceramic body 110 and may include the first and fourth internal electrodes 121 and 124 exposed to the first and second main surfaces 5 and 6, and the second and third internal electrodes 122 and 123 exposed to the first main surface 5 to form an inductance.

Particularly, the inductor part may include the first inductor part L1 including the third and fourth internal electrodes 123 and 124 and the second inductor part L2 including the first and second internal electrodes 121 and 122, each of the inductor parts L1 and L2 forming an inductance.

The first internal electrode 121 may be connected to the second and fifth external electrodes 132 and 135, the second internal electrode 122 may be connected to the fifth and sixth external electrodes 135 and 136, the third internal electrode 123 may be connected to the fourth and sixth external electrodes 134 and 136, and the fourth internal electrode 124 may be connected to the first and fourth external electrodes 131 and 134.

That is, a signal input to the first external electrode 131 used as the signal input terminal may pass through the first inductor part L1 including the third and fourth internal electrodes 123 and 124 and the second inductor part L2 including the first and second internal electrodes 121 and 122, such that a signal from which noise is removed may be output through the second external electrode 132 used as the signal output terminal.

Referring to FIG. 3, the capacitor part may be formed within the ceramic body 110 and may include the fifth internal electrode 125 exposed to the first main surface 5 and the sixth internal electrode 126 exposed to the second main surface 6 to form a capacitance.

The fifth internal electrode 125 may be connected to the sixth external electrode 136, and the sixth internal electrode 126 may be connected to the third external electrode 133.

In an exemplary embodiment of the present disclosure, the second and third internal electrodes 122 and 123 and the fifth internal electrode 125 may be connected to each other through the sixth external electrode 136, such that the inductor part and the capacitor part may be connected to each other.

The capacitor part may be disposed in the ceramic body 110 without particular limitations, and a plurality of capacitor parts may be stacked in order to implement a target capacitance value.

Meanwhile, referring to FIGS. 2 through 4, the multilayer chip electronic component 100 may include the first connecting electrode 127 formed within the ceramic body 110 and exposed to the second main surface 6 and the first end surface 1 of the ceramic body 110 and the second connecting electrode 128 formed within the ceramic body 110 and exposed to the second main surface 6 and the second end surface 2 of the ceramic body 110.

The order of stacking the first to sixth internal electrodes 121 to 126 and the first and second connecting electrodes 127 and 128 is not particularly limited.

For example, dielectric layers on which the first and second connecting electrodes 127 and 128 are formed as shown in FIG. 4 may be repeatedly disposed between dielectric layers on which the first to sixth internal electrodes 121 to 126 are formed.

In addition, although each of the first to sixth internal electrodes 121 to 126 is provided in a singular number and each of the first and second connecting electrodes 127 and 128 is provided in a singular number in FIGS. 2 through 4, actually, each of the first to sixth internal electrodes 121 to 126 may be provided in plural numbers.

In addition, pattern shapes of the first to sixth internal electrodes 121 to 126 shown in FIGS. 2 and 3 are provided by way of example according to an exemplary embodiment of the present disclosure, and the first to sixth internal electrodes 121 to 126 may have various pattern shapes in order to control inductance and capacitance.

Figure 5:
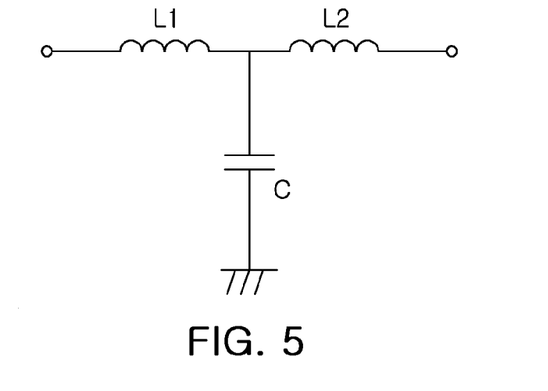
FIG. 5 is an equivalent circuit diagram of the multilayer chip electronic component shown in FIG. 1.

FIG. 5 is an equivalent circuit diagram of the multilayer chip electronic component shown in FIG. 1.

Referring to FIG. 5, the first inductor part L1 including the third and fourth internal electrodes 123 and 124, the second inductor part L2 including the first and second internal electrodes 121 and 122, and the capacitor part C including the fifth and sixth internal electrodes 125 and 126 may be connected to each other.

The multilayer chip electronic component according to an exemplary embodiment of the present disclosure as described above may have two kinds of inductors and a single capacitor, and values of the inductors and the capacitor may be controlled.

The multilayer chip electronic component according to an exemplary embodiment of the present disclosure has the above-mentioned structure, whereby noise removal efficiency within high frequency regions may be higher as compared with a structure according to the related art and a mounting space and costs required therefor may be reduced due to a decrease in the number of components.

In addition, in the multilayer chip electronic component according to an exemplary embodiment of the present disclosure, the inductor part may be configured without using a through-hole electrode, whereby a manufacturing cost may be reduced.

Further, since the multilayer chip electronic component is mounted on a board to be perpendicular thereto, the implementation of downsizing may not be hindered by the non-contact terminals, which is advantageous in miniaturizing a product.

Figure 6:
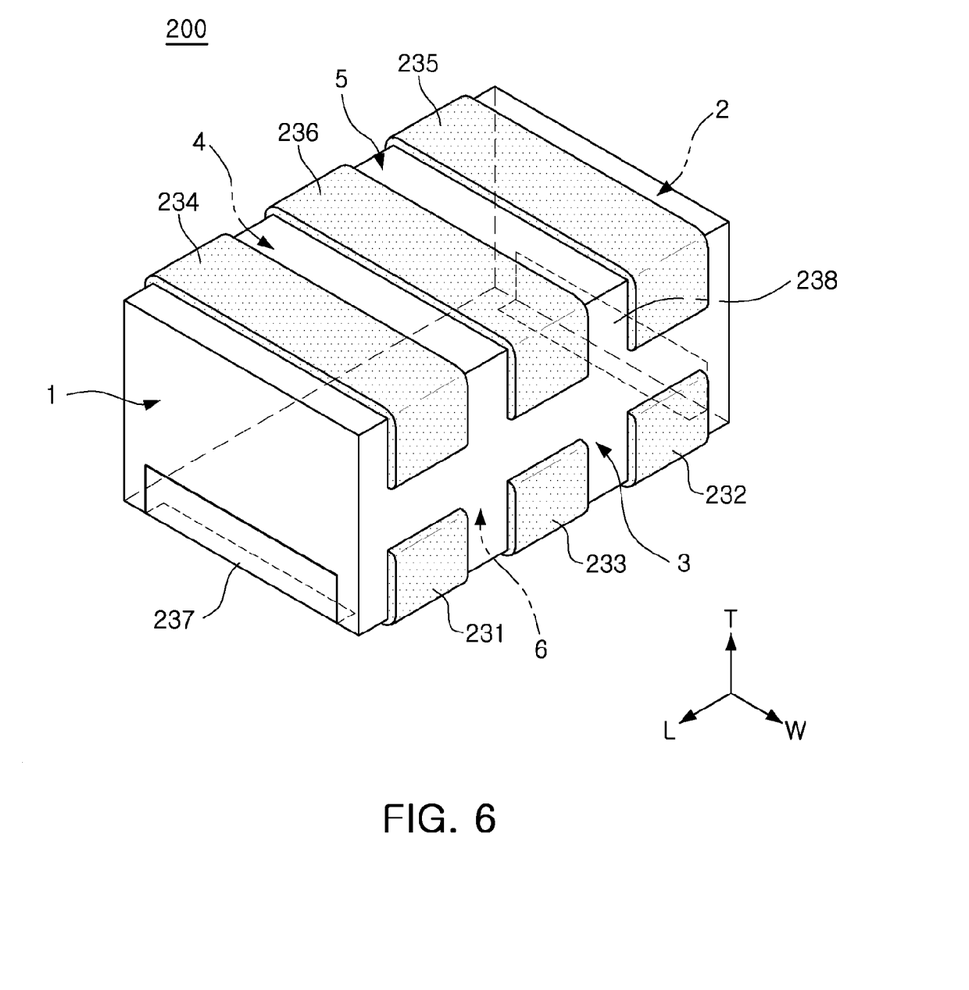
FIG. 6 is a perspective view of a multilayer chip electronic component according to another exemplary embodiment of the present disclosure.

FIG. 6 is a perspective view of a multilayer chip electronic component according to another exemplary embodiment of the present disclosure.

Figure 7:
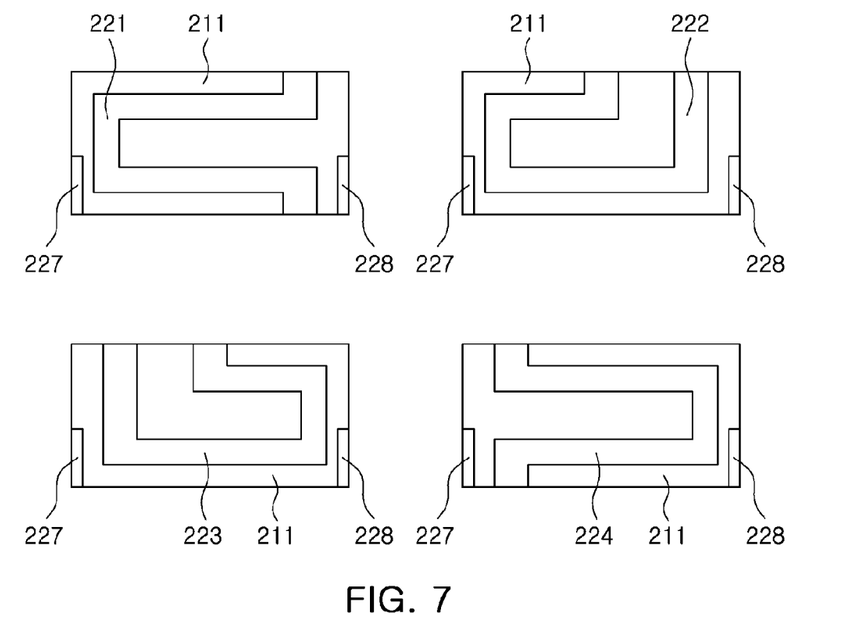
FIG. 7 is a plan view illustrating first to fourth internal electrodes usable in the multilayer chip electronic component shown in FIG. 6.

FIG. 7 is a plan view illustrating first to fourth internal electrodes usable in the multilayer chip electronic component shown in FIG. 6.

Figure 8:
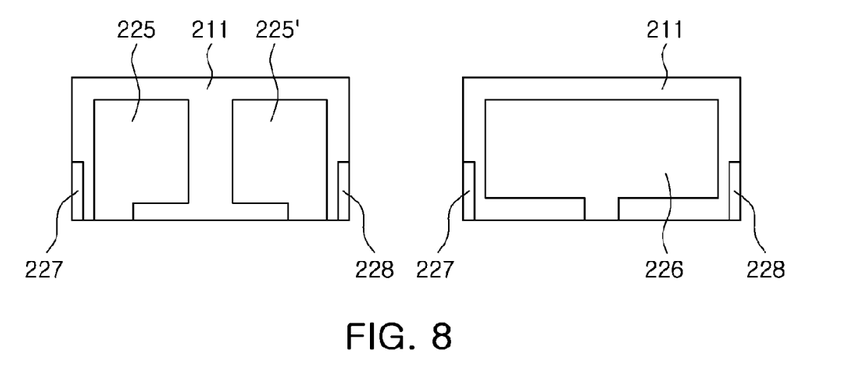
FIG. 8 is a plan view illustrating fifth and sixth internal electrodes usable together with the first to fourth internal electrodes shown in FIG. 7.

FIG. 8 is a plan view illustrating fifth and sixth internal electrodes usable together with the first to fourth internal electrodes shown in FIG. 7.

Figure 9:
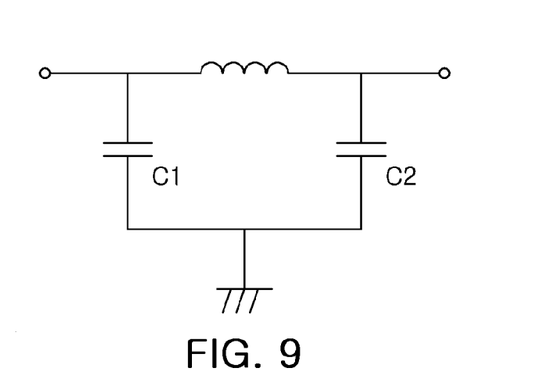
FIG. 9 is an equivalent circuit diagram of the multilayer chip electronic component shown in FIG. 6.

FIG. 9 is an equivalent circuit diagram of the multilayer chip electronic component shown in FIG. 6.

Referring to FIGS. 6 through 9, a multilayer chip electronic component 200 according to another exemplary embodiment of the present disclosure may include a ceramic body 210 including a plurality of dielectric layers 211 and having first and second main surfaces 5 and 6 opposing each other, first and second side surfaces 3 and 4 opposing each other, and first and second end surfaces 1 and 2 opposing each other; an inductor part formed within the ceramic body 210 and including first and fourth internal electrodes 221 and 224 exposed to the first and second main surfaces 5 and 6, and the second and third internal electrodes 222 and 223 exposed to the first main surface 5; a capacitor part formed within the ceramic body 210 and including two fifth internal electrodes 225 and 225' exposed to the second main surface 5 and a sixth internal electrode 226 exposed to the second main surface 6; a first connecting electrode 227 formed within the ceramic body 210 and exposed to the second main surface 6 and the first end surface 1 of the ceramic body 210 and a second connecting electrode 228 formed within the ceramic body 210 and exposed to the second main surface 6 and the second end surface 2 of the ceramic body 210; and first to sixth external electrodes 231 to 236 formed on the first and second main surfaces 5 and 6 of the ceramic body 210 and electrically connected to the first to sixth internal electrodes 221 to 226, a first connection terminal 237 formed on the second main surface 6 and the first end surface 1 of the ceramic body 210 and connected to the first connecting electrode 227, and a second connection terminal 238 formed on the second main surface 6 and the second end surface 2 of the ceramic body 210 and connected to the second connecting electrode 228, and in this case, the capacitor part is composed of first and second capacitor parts C1 and C2 and the inductor part L and the capacitor parts C1 and C2 are connected to each other.

Particularly, in the multilayer chip electronic component 200 according to another exemplary embodiment of the present disclosure, the two fifth internal electrodes 225 and 225' may be formed on a single dielectric layer to be insulated from each other.

The capacitor part may be formed by the fifth and sixth internal electrodes, and the two fifth internal electrodes 225 and 225' that are insulated from each other on a single dielectric layer and the sixth internal electrode 226 may configure the first and second capacitor parts C1 and C2, respectively, and may be connected to each other.

In another exemplary embodiment of the present disclosure, the two fifth internal electrodes 225 and 225' may be connected to the first and second external electrodes 231 and 232, respectively, and the sixth internal electrode 226 may be connected to the third external electrode 233.

In another exemplary embodiment of the present disclosure, the first and fourth internal electrodes 221 and 224 and the two fifth internal electrodes 225 and 225' are connected to each other through the first and second external electrodes 231 and 232, such that the inductor part L and the capacitor parts C1 and C2 may be connected to each other.

Referring to FIG. 9, the first and second capacitor parts C1 and C2 respectively configured by the two fifth internal electrodes 225 and 225' and the sixth internal electrode 226, and the inductor part L including the first to fourth internal electrodes 221 to 224 may be connected to each other.

Since other features of the multilayer chip electronic component according to another exemplary embodiment of the present disclosure are the same as those of the multilayer chip electronic component according to an exemplary embodiment of the present disclosure described above, a description thereof will be omitted.

Figure 10:
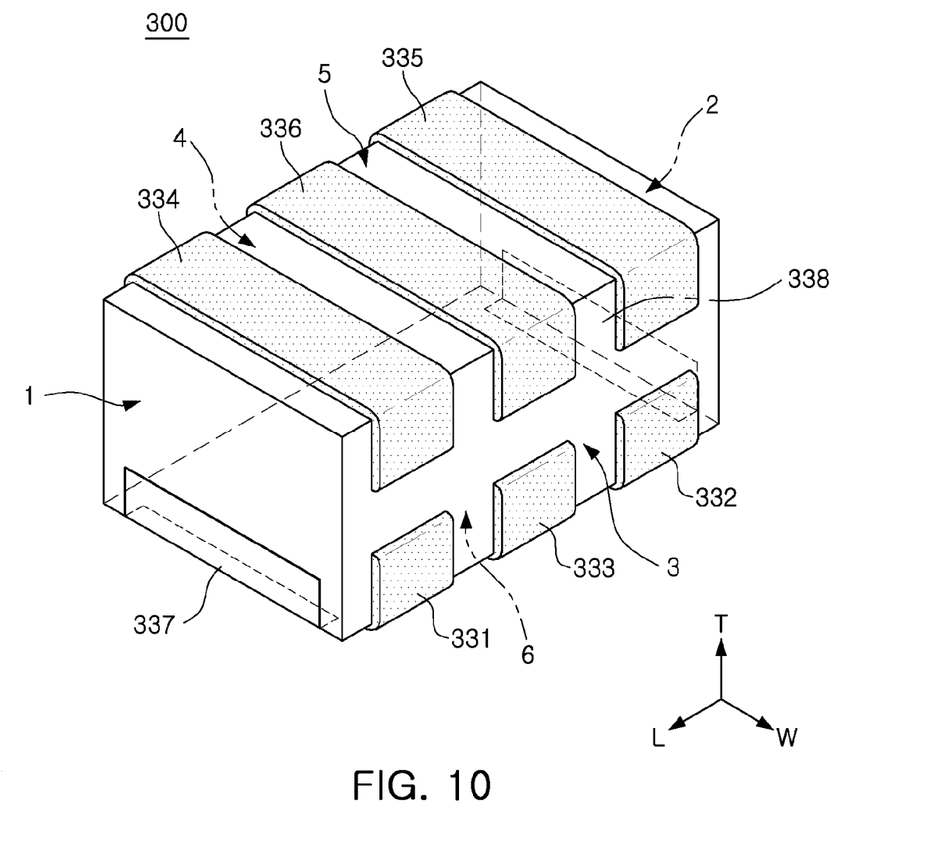
FIG. 10 is a perspective view of a multilayer chip electronic component according to another exemplary embodiment of the present disclosure.

FIG. 10 is a perspective view of a multilayer chip electronic component according to another exemplary embodiment of the present disclosure.

Figure 11:
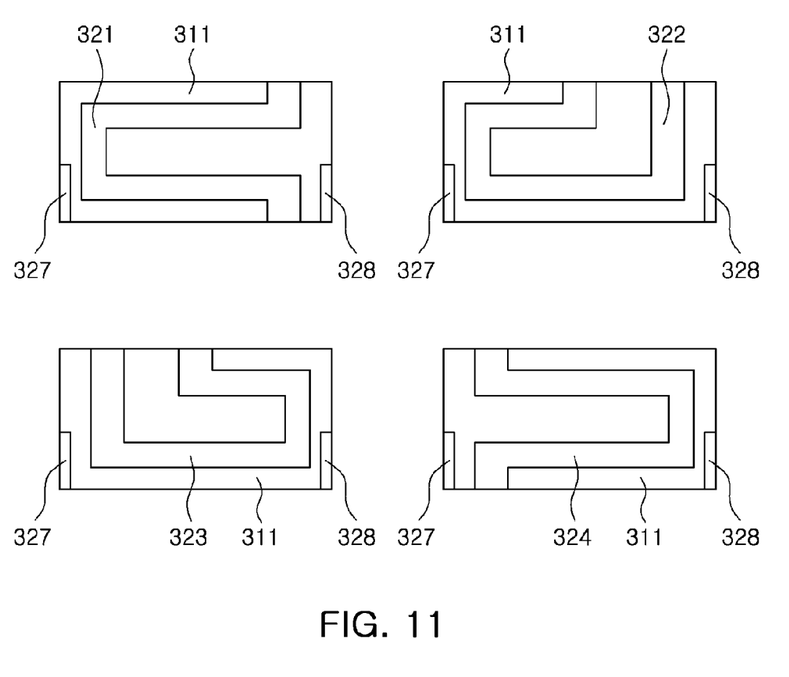
FIG. 11 is a plan view illustrating first to fourth internal electrodes usable in the multilayer chip electronic component shown in FIG. 10.

FIG. 11 is a plan view illustrating first to fourth internal electrodes usable in the multilayer chip electronic component shown in FIG. 10.

Figure 12:
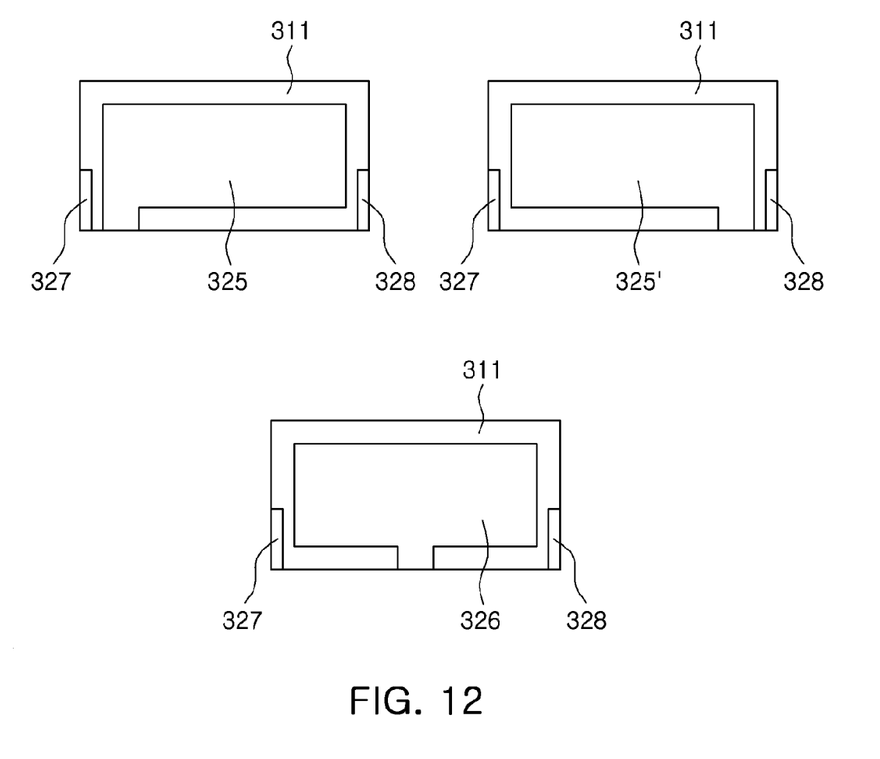
FIG. 12 is a plan view illustrating fifth and sixth internal electrodes usable together with the first to fourth internal electrodes shown in FIG. 11.

FIG. 12 is a plan view illustrating fifth and sixth internal electrodes usable together with the first to fourth internal electrodes shown in FIG. 11.

Referring to FIGS. 10 through 12, a multilayer chip electronic component 300 according to another exemplary embodiment of the present disclosure may include a ceramic body 310 including a plurality of dielectric layers 311 and having first and second main surfaces 5 and 6 opposing each other, first and second side surfaces 3 and 4 opposing each other, and first and second end surfaces 1 and 2 opposing each other; an inductor part formed within the ceramic body 310 and including first and fourth internal electrodes 321 and 324 exposed to the first and second main surfaces 5 and 6, and second and third internal electrodes 322 and 323 exposed to the first main surface 5; a capacitor part C formed within the ceramic body 310 and including two fifth internal electrodes 325 and 325' exposed to the second main surface 6 and a sixth internal electrode 326 exposed to the second main surface 6; a first connecting electrode 327 formed within the ceramic body 310 and exposed to the second main surface 6 and the first end surface 1 of the ceramic body 310 and a second connecting electrode 328 formed within the ceramic body 310 and exposed to the second main surface 6 and the second end surface 2 of the ceramic body 310; and first to sixth external electrodes 331 to 336 formed on the first and second main surfaces 5 and 6 of the ceramic body 310 and electrically connected to the first to sixth internal electrodes 321 to 326, a first connection terminal 337 formed on the second main surface 6 and the first end surface 1 of the ceramic body 310 and connected to the first connecting electrode 327, and a second connection terminal 338 formed on the second main surface 6 and the second end surface 2 of the ceramic body 310 and connected to the second connecting electrode 328, and in this case, the capacitor part is composed of first and second capacitor parts C1 and C2, the inductor part L and the capacitor parts C1 and C2 are connected to each other, and the two fifth internal electrodes 325 and 325' are separately formed on individual dielectric layers.

The capacitor part may be formed by the fifth internal electrodes 325 and 325' and the sixth internal electrode 326. The two fifth internal electrodes 325 and 325' that are separately formed on individual dielectric layers and the sixth internal electrode 326 may configure the first and second capacitor parts C1 and C2 and may be connected in parallel with each other.

In another exemplary embodiment of the present disclosure, the two fifth internal electrodes 325 and 325' may be connected to the first and second external electrodes 331 and 332, respectively, and the sixth internal electrode 326 may be connected to the third external electrode 333.

In another exemplary embodiment of the present disclosure, the first and fourth internal electrodes 321 and 324 and the two fifth internal electrodes 325 and 325' are connected to each other through the first and second external electrodes 331 and 332, such that the inductor part L and the capacitor parts C1 and C2 may be connected to each other.

Since other features of the multilayer chip electronic component according to another exemplary embodiment of the present disclosure are the same as those of the multilayer chip electronic component according to exemplary embodiments of the present disclosure described above, a description thereof will be omitted.

Board Having Multilayer Chip Electronic Component

Figure 13:
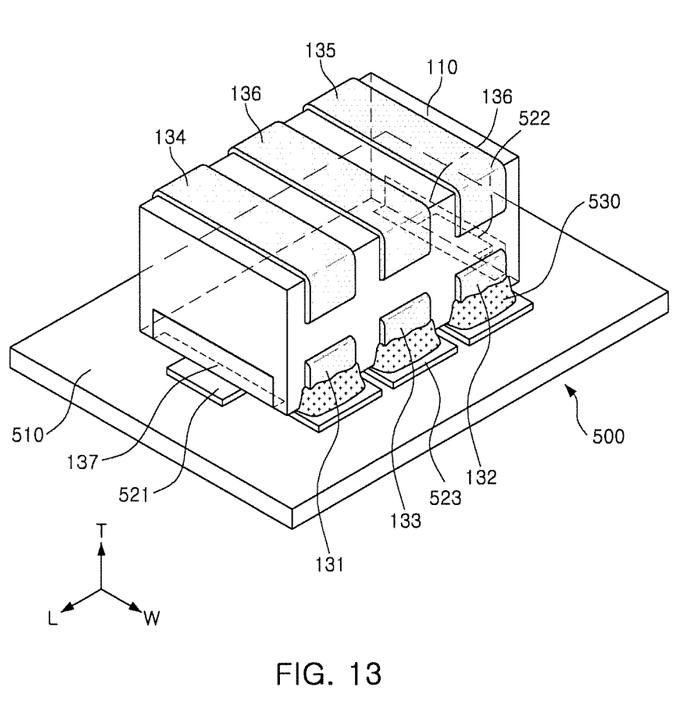
FIG. 13 is a perspective view illustrating a form in which the multilayer chip electronic component of FIG. 1 is mounted on a printed circuit board.

FIG. 13 is a perspective view illustrating a form in which the multilayer chip electronic component of FIG. 1 is mounted on a printed circuit board.

Referring to FIG. 13, a board 500 having a multilayer chip electronic component 100 according to the exemplary embodiment may include a printed circuit board 510 (PCB) on which the internal electrodes of the multilayer chip electronic component 100 are mounted to be perpendicular thereto; first to third electrode pads 521 to 523 formed on an upper surface of the printed circuit board 510 to be spaced apart from each other.

In this case, the multilayer chip electronic component 100 may be electrically connected to the printed circuit board 510 by solder 530 in a state in which the first to third external electrodes 131 to 133 are positioned on the first to third electrode pads 521 to 523 to come into contact therewith.

Except for the above-mentioned description, a description of features overlapped with those of the multilayer chip electronic component according to an exemplary embodiment of the present disclosure described as above will be omitted.

As set forth above, according to exemplary embodiments of the present disclosure, the multilayer chip electronic component may include the inductor part and the capacitor part and control respective values of the inductor part and the capacitor part.

Therefore, the multilayer chip electronic component according to exemplary embodiments of the present disclosure may have high noise removal efficiency in high frequency regions as compared to a structure according to the related art, and a mounting space and costs may be decreased due to a decrease in the number of required components.

In addition, in the multilayer chip electronic component according to exemplary embodiments of the present disclosure, the inductor part may be configured without using a through-hole electrode, whereby a manufacturing cost may be reduced.

Further, since the multilayer chip electronic component is mounted on a board to be perpendicular thereto, the implementation of downsizing may not be hindered by the non-contact terminals, which is advantageous in miniaturizing a product.

Further, connection conductors formed of a plating layer may be further formed on both end surfaces of the multilayer chip electronic component, such that solder may be formed on the connection conductor at the time of mounting the multilayer chip electronic component on the board, whereby adhesion properties of the multilayer chip electronic component may be improved.

While exemplary embodiments have been shown and described above, it will be apparent to those skilled in the art that modifications and variations could be made without departing from the spirit and scope of the present disclosure as defined by the appended claims.

What is claimed is:

1. A multilayer chip electronic component comprising:
   a ceramic body including a plurality of dielectric layers and having first and second main surfaces opposing each other, first and second side surfaces opposing each other, and first and second end surfaces opposing each other;
   an inductor part disposed within the ceramic body and including first and fourth internal electrodes exposed to the first and second main surfaces and second and third internal electrodes exposed to the first main surface;
   a capacitor part disposed within the ceramic body and including a fifth internal electrode exposed to the first main surface and a sixth internal electrode exposed to the second main surface;
   a first connecting electrode disposed within the ceramic body and exposed to the second main surface and the first end surface of the ceramic body and a second connecting electrode disposed within the ceramic body and exposed to the second main surface and the second end surface of the ceramic body; and
   first to sixth external electrodes disposed on the first and second main surfaces of the ceramic body and electrically connected to the first to sixth internal electrodes, a first connection terminal disposed on the second main surface and the first end surface of the ceramic body and connected to the first connecting electrode, and a second connection terminal disposed on the second main surface and the second end surface of the ceramic body and connected to the second connecting electrode,
   wherein the inductor part is composed of first and second inductor parts, and the inductor part and the capacitor part are connected to each other.

2. The multilayer chip electronic component of claim 1, wherein the first internal electrode is connected to the second and fifth external electrodes, the second internal electrode is connected to the fifth and sixth external electrodes, the third internal electrode is connected to the fourth and sixth external electrodes, and the fourth internal electrode is connected to the first and fourth external electrodes.

3. The multilayer chip electronic component of claim 1, wherein the fifth internal electrode is connected to the sixth external electrode, and the sixth internal electrode is connected to the third external electrode.

4. The multilayer chip electronic component of claim 1, wherein the second and third internal electrodes and the fifth internal electrode are connected to each other through the sixth external electrode, such that the inductor part and the capacitor part are connected to each other.

5. The multilayer chip electronic component of claim 1, wherein the first and second connection terminals are formed of a plating layer.

6. A board having a multilayer chip electronic component, comprising:
    a printed circuit board having first to third electrode pads disposed thereon; and
    the multilayer chip electronic component of claim 1 mounted on the printed circuit board.

7. A multilayer chip electronic component comprising:
    a ceramic body including a plurality of dielectric layers and having first and second main surfaces opposing each other, first and second side surfaces opposing each other, and first and second end surfaces opposing each other;
    an inductor part disposed within the ceramic body and including first and fourth internal electrodes exposed to the first and second main surfaces and second and third internal electrodes exposed to the first main surface;
    a capacitor part disposed within the ceramic body and including two fifth internal electrodes exposed to the second main surface and a sixth internal electrode exposed to the second main surface;
    a first connecting electrode disposed within the ceramic body and exposed to the second main surface and the first end surface of the ceramic body and a second connecting electrode disposed within the ceramic body and exposed to the second main surface and the second end surface of the ceramic body; and
    first to sixth external electrodes disposed on the first and second main surfaces of the ceramic body and electrically connected to the first to sixth internal electrodes, a first connection terminal disposed on the second main surface and the first end surface of the ceramic body and connected to the first connecting electrode, and a second connection terminal disposed on the second main surface and the second end surface of the ceramic body and connected to the second connecting electrode,
    wherein the capacitor part is composed of first and second capacitor parts, and the inductor part and the capacitor part are connected to each other.

8. The multilayer chip electronic component of claim 7, wherein the two fifth internal electrodes are separately disposed on individual dielectric layers of the plurality of dielectric layers.

9. The multilayer chip electronic component of claim 7, wherein the first internal electrode is connected to the second and fifth external electrodes, the second internal electrode is connected to the fifth and sixth external electrodes, the third internal electrode is connected to the fourth and sixth external electrodes, and the fourth internal electrode is connected to the first and fourth external electrodes.

10. The multilayer chip electronic component of claim 7, wherein the two fifth internal electrodes are connected to the first and second external electrodes, respectively, and the sixth internal electrode is connected to the third external electrode.

11. The multilayer chip electronic component of claim 7, wherein the first and fourth internal electrodes and the two fifth internal electrodes are connected to each other through the first and second external electrodes, such that the inductor part and the capacitor part are connected to each other.

12. The multilayer chip electronic component of claim 7, wherein the first and second connection terminals are formed of a plating layer.

13. The multilayer chip electronic component of claim 7, wherein the two fifth internal electrodes are disposed on a single dielectric layer of the plurality of dielectric layers to be insulated from each other.

14. A board having a multilayer chip electronic component, comprising:
    a printed circuit board having first to third electrode pads disposed thereon; and
    the multilayer chip electronic component of claim 7 mounted on the printed circuit board.

* * * * *